United States Patent
Zambrano et al.

[11] Patent Number: 5,986,323
[45] Date of Patent: Nov. 16, 1999

[54] HIGH-FREQUENCY BIPOLAR TRANSISTOR STRUCTURE

[75] Inventors: Raffaele Zambrano, San Giovanni La Punta; Giuseppe Fallico, Acicastello, both of Italy

[73] Assignee: Consorzio per la Ricerca sulla Microelettronica nel Mezzogiorno, Catania, Italy

[21] Appl. No.: 08/549,267

[22] Filed: Oct. 27, 1995

[30] Foreign Application Priority Data

Oct. 28, 1994 [EP] European Pat. Off. ............ 94830512

[51] Int. Cl.⁶ .................. H01L 27/82; H01L 27/102; H01L 29/70; H01L 31/11
[52] U.S. Cl. ................... 257/576; 257/587; 257/588
[58] Field of Search ................... 257/290, 281, 257/443, 448, 576, 587, 588

[56] References Cited

U.S. PATENT DOCUMENTS

| | | | |
|---|---|---|---|
| 4,495,512 | 1/1985 | Isaac et al. | 257/588 |
| 5,177,582 | 1/1993 | Meister et al. | 257/588 |
| 5,283,201 | 2/1994 | Tsang et al. | 437/31 |
| 5,320,972 | 6/1994 | Wylie | 437/31 |
| 5,502,330 | 3/1996 | Johnson et al. | 257/588 |
| 5,541,124 | 7/1996 | Miwa et al. | 437/31 |
| 5,583,368 | 12/1996 | Kenney | 257/621 |
| 5,607,866 | 3/1997 | Sato et al. | 437/31 |

OTHER PUBLICATIONS

P.C. Hunt, "Bipolar Device Design for High Density High Performance Applications", IEDM 1989 p. 791–794.

D.L. Harame, et. al., "30 GHz Polysilicon–Emitter and Single–Crystal–Emitter Graded SiGe–Base PNP Transistors", International Electron Devices Meeting Technical Digest, Dec. 3–6, 1989, p. 90.33—90.36.

R. Dekker, et al., "Charge Sharing Effects in Bipolar Transistors with Sub–Halfmicron Emitter Widths", International Electron Devices Meeting Technical Digest, Dec. 9–12, 1990, p. 90.29—90.32.

Primary Examiner—Mahshid Saadat
Assistant Examiner—Allan R. Wilson
Attorney, Agent, or Firm—Wolf, Greenfield & Sacks, P.C.

[57] ABSTRACT

A high-frequency bipolar transistor structure includes a base region of a first conductivity type formed in a silicon layer of a second conductivity type, the base region comprising an intrinsic base region surrounded by an extrinsic base region, an emitter region of the second conductivity type formed inside the intrinsic base region, the extrinsic base region and the emitter region being contacted by a first polysilicon layer and a second polysilicon layer respectively. The first and the second polysilicon layers are respectively contacted by a base metal electrode and an emitter metal electrode. Between the extrinsic base region and the first polysilicon layer, a silicide layer is provided to reduce the extrinsic base resistance of the bipolar transistor.

16 Claims, 3 Drawing Sheets

HIGH-FREQUENCY BIPOLAR TRANSISTOR STRUCTURE

BACKGROUND OF THE INVENTION

1. Field of the Invention

The present invention relates to a high-frequency bipolar transistor structure, and to a related manufacturing process.

2. Discussion of the Related Art

Sophisticated techniques are employed to fabricate high-frequencies bipolar transistors, with cutoff frequency higher than 20 GHz, propagation delays below 40 ps and speed-power products of about 40 fJ. Such techniques involve, for example, dielectric or trench isolation, multiple polysilicon layers, self-aligned processes making use of $SiO_2$ or composite material spacers, rapid thermal processes (RTP), and so on.

High-performance Double PolySilicon Self-Aligned Transistors (DPSSATs) feature shallow junctions, with the emitter region formed by diffusion of dopants from an overlaying second polysilicon layer into the intrinsic base region; this last is surrounded by a heavily doped extrinsic base region, which is formed by diffusion of dopants from a first polysilicon layer into an epitaxial layer. The second and first polysilicon layers are respectively contacted by metal emitter and base electrodes. The intrinsic base can be formed by implantation, or by diffusion of dopants through the second polysilicon layer.

A review of such transistors can be found in P. C. Hunt, "Bipolar device design for high density high performance applications", Proceedings of IEDM 1989, 791–794, which is incorporated herein by reference.

To improve the AC performance of these transistors, their distributed base resistance ($r_{bb}$) should be reduced. In this way, the charge/discharge time of the emitter-base junction capacitance would be decreased, and the dynamic behavior of the transistors improved. Further, the Noise Figure (NF) would be significantly reduced.

To further improve the speed performance the extrinsic base region should be shallower than the intrinsic base. The influence of the ratio of the extrinsic base to the intrinsic base junction depths is described in R. Dekker et al, "Charge Sharing Effects in Bipolar Transistors with Sub-half-micron Emitter Widths", Proceedings of IEDM 1990, 29–32, which is incorporated herein by reference. A shallower extrinsic base region would also allow a reduction in the base-collector junction parasitic capacitance, since the distance between the junction and the buried layer would increase, and the depletion region would be wider.

In view of the state of the art discussed, it is an object of the present invention to provide a high-frequency bipolar transistor structure with improved speed performance.

SUMMARY OF THE INVENTION

According to the present invention, such and other objects are attained by means of a high-frequency bipolar transistor structure, comprising a base region of a first conductivity type formed in a silicon layer of a second conductivity type, said base region comprising an intrinsic base region surrounded by an extrinsic base region, an emitter region of the second conductivity type formed inside said intrinsic base region, the extrinsic base region and the emitter region being respectively contacted by a first and a second polysilicon layers, said first and second polysilicon layers being respectively contacted by a base metal electrode and an emitter metal electrode, wherein between said extrinsic base region and said first polysilicon layer a silicide layer is provided to reduce the extrinsic base resistance of the transistor.

As a result of the present invention, a high-frequency bipolar transistor structure is provided with improved speed performance over the known transistor structures; the improvement is made possible by the presence of a silicide layer between the first polysilicon layer and the silicon surface, which reduces the distributed base resistance ($r_{bb}$)

Also according to the present invention, a process for the manufacturing of a high-frequency bipolar transistor structure is provided, comprising the following steps:

a) selectively forming a thick field oxide region on a silicon layer of a first conductivity type;

b) forming a silicide layer at least over the silicon layer;

c) depositing over the entire structure a first polysilicon layer;

d) doping the first polysilicon layer with a dopant of a second conductivity type;

e) forming over the first polysilicon layer an oxide layer;

f) selectively removing the oxide layer, the first polysilicon layer and the silicide layer to open an emitter window over the silicon layer;

g) forming an intrinsic base region of the second conductivity type in the silicon layer under the emitter window;

h) forming insulating sidewall spacers at the edges of the emitter window;

i) depositing a second polysilicon layer over the silicon layer at the emitter window;

l) doping the second polysilicon layer with a dopant of a first conductivity type;

m) performing a thermal process to make the dopants in the first polysilicon layer and the second polysilicon layer diffuse into the silicon layer and the intrinsic base region, respectively, to form an extrinsic base region of the second conductivity type and an emitter region of the first conductivity type.

As a result of the process according to the invention, it is possible to fabricate a high-frequency bipolar transistor with low distributed base resistance, and with an extrinsic base region shallower than the intrinsic base region. In fact, the presence of the silicide layer prevents the dopant in the first polysilicon layer from diffusing deeply in the silicon layer. This further increases the speed of the bipolar transistor.

BRIEF DESCRIPTION OF THE DRAWINGS

The features of the present invention will be made more evident by the following detailed description of two particular embodiments, illustrated as non limiting examples in the annexed drawings, wherein.

DETAILED DESCRIPTION

Figure 1A:
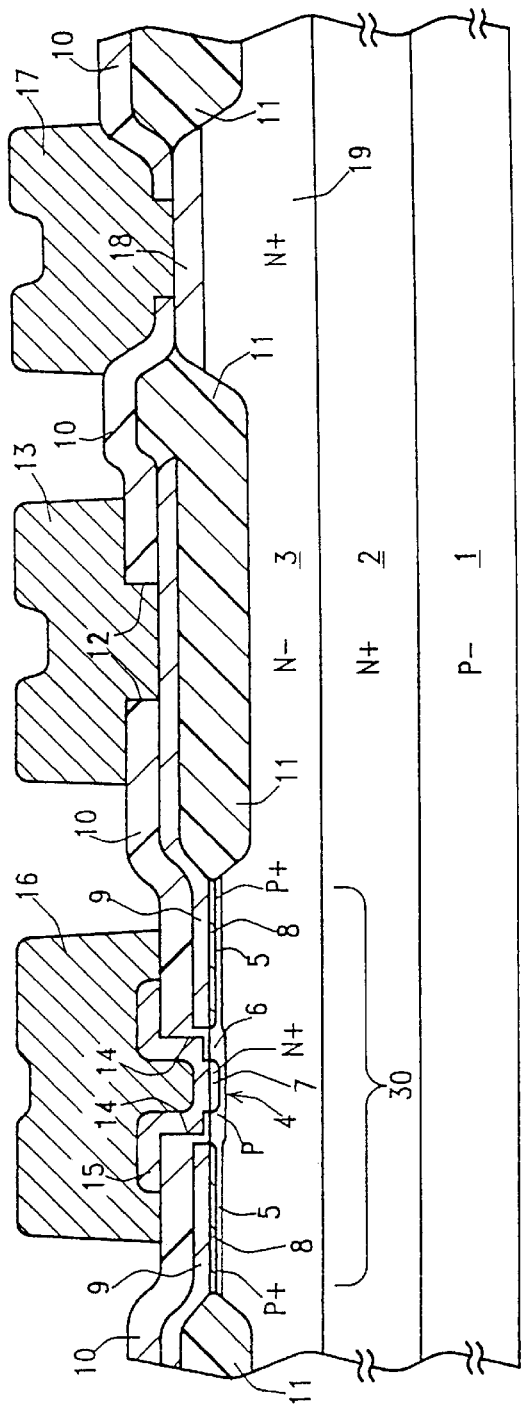
FIG. 1A is a cross-sectional view of a high-frequency bipolar transistor integrated structure according to a first embodiment of the present invention.

FIG. 1A is a cross-sectional view of a high-frequency bipolar transistor integrated structure according to a first embodiment of the present invention. Such a structure comprises a lightly doped P type semiconductor substrate 1, over which a heavily doped N type buried layer 2 is provided. A lightly doped N type epitaxial layer 3 is further provided over the buried layer 2.

The bipolar transistor comprises a P type base region 4 formed in a portion 30 of the epitaxial layer 3 comprised between thick field oxide areas 11. The base region 4 comprises a heavily doped P type contact region 5 also called an "extrinsic base" region, which extends to the field oxide 11, and a lightly doped P type region 6 called an "intrinsic base" region. A heavily doped N type emitter region 7 is formed inside the intrinsic base region 6.

Over the extrinsic base region 5, a silicide layer 8 is provided; preferably, cobalt silicide ($CoSi_2$) is employed, but other suicides are suitable, such as tantalum silicide ($TaSi_2$), titanium silicide ($TiSi_2$) or tungsten silicide ($WSi_2$).

The properties of silicide and polycide films are well known; a good review of these materials can be found in S. M. Sze, "VLSI Technology", McGraw-Hill, 1983, 372–380, which is incorporated herein by reference.

The cobalt silicide layer 8 is covered by a polysilicon layer 9, doped with acceptor impurities, which is in turn covered by an oxide layer 10. The polysilicon layer 9 and the oxide layer 10 extend over the field oxide 11.

Over the field oxide area 11, a contact window 12 is provided in the oxide layer 10 to allow a base metal electrode 13 to contact the polysilicon layer 9.

Another window in the oxide layer 10 and in the underlying polysilicon layer 9 is provided over the intrinsic base region 6, and spacers 14 are formed at the edges of this window; as described in the already cited paper of P. C. Hunt, the spacers 14 can be made of oxide or, alternatively, of oxide and nitride. A first polysilicon portion 15, formed from a second polysilicon layer doped with donor impurities, contacts the emitter region 7 formed in the portion of the intrinsic base region 6 not covered by oxide. An emitter metal electrode 16 contacts the polysilicon strip 15.

A collector metal electrode 17 contacts a second portion 18 of the second polysilicon layer over a heavily doped N type sink region 19 formed in the epitaxial layer 3 and extending down to the buried layer 2.

The presence of the silicide layer 8 below the acceptor-doped polysilicon layer 9 which provides the contact to the extrinsic base region 5 allows for greatly reducing the distributed base resistance ($r_{bb}$) of the bipolar transistor, because of the low sheet resistance of suicide (only a few Ohms/square) with respect to the relatively high sheet resistance of acceptor-doped polysilicon (several tens of Ohms/square). As already mentioned, a low base resistance means a reduced charge/discharge time of the emitter-base junction capacitance, and thus better dynamic behavior.

A process for the manufacturing of the bipolar transistor structure of FIG. 1A starts with the formation of the N+ buried layer 2 over the P− substrate 1, and with the epitaxial growth of the N− layer 3 over the buried layer 2.

The thick field oxide areas 1 1 are formed over the epitaxial layer 3 by means of the known LOCOS technique.

After the removal of the $Si_3N_4$ and pad oxide layers, a thin layer of cobalt is deposited over the entire surface of the structure (i.e. over the layer 3 and the field oxide 11); the cobalt layer can have a thickness of some hundreds of nanometers.

Figure 2:
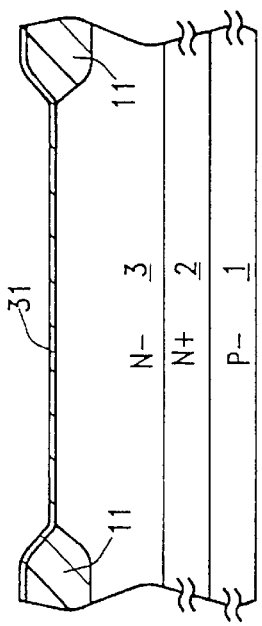
FIGS. 2 to 4 are cross-sectional views of a portion of the high-frequency bipolar transistor structure of FIG. 1A, taken at intermediate steps of its manufacturing process.

The structure is then submitted to a thermal process. Where the cobalt layer is in contact with silicon, a cobalt silicide layer 8 is formed, whereas in the areas where the cobalt layer is superimposed over silicon dioxide 11, cobalt does not react and no silicide is formed. The cobalt layer is then removed from the silicon oxide 11 (FIG. 2).

The first polysilicon layer 9 is then deposited over the entire surface of the structure (i.e. over the cobalt silicide layer 8 and over the field oxide 11), and it is successively acceptor-doped by means of a boron implant; the oxide layer 10 is then formed over the polysilicon layer 9.

The oxide layer 10, the underlying polysilicon layer 9 and the silicide layer 8 are then selectively removed to open a window where the intrinsic base region is to be formed.

Figure 3:
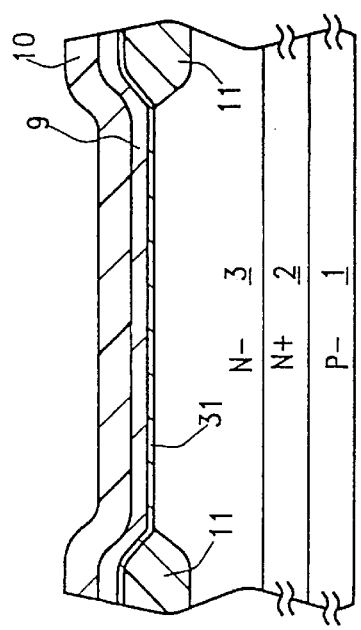

Acceptor ions are then implanted into the N− layer 3 using the oxide layer 10 as a mask, to form the intrinsic base region 6 (FIG. 3). Such an implanting step can be preceded by a growth of a thin thermal oxide layer. It is also possible not to form the intrinsic base region 6 at this step, and to define only a link-up region more lightly doped than the intrinsic base region 6, necessary to guarantee that the intrinsic and extrinsic base regions will be effectively linked.

It is worth noting that the presence of the silicide layer 8 also improves the etching process of the polysilicon layer 9. In conventional structures, wherein the polysilicon layer is in direct contact with silicon, the silicon is inevitably partially etched during the etching of the polysilicon layer.

Figure 4:
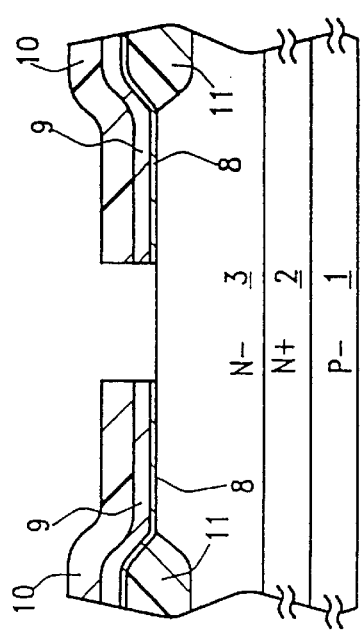

The process continues with the formation of the spacers 14, and the deposition of a second layer of polysilicon. This second layer of polysilicon is then donor-doped by implanting a heavy dose of As, to form the polysilicon emitter contact 15. The extrinsic base region 5 and the emitter region 7 are then diffused from the first polysilicon layer 9 and from the portion 15 of the second polysilicon layer into the N− layer 3 and the intrinsic base region 6, respectively (FIG. 4).

As shown in the drawings, the extrinsic base region 5 is shallower than the intrinsic base region 6, while in conventional structures the former was deeper than the latter. This is for two reasons. First, the intrinsic base region 6 is defined at the surface of the epitaxial layer 3, while the P type polysilicon layer 9, heavily doped, is separated from the surface of the layer 3 by the silicide layer 8. Second, the boron coming from the polysilicon layer 9 must pass through the silicide layer 8 before reaching the silicon surface.

The process ends with the definition of the contact areas to the first layer of polysilicon, and of the metallizations, to obtain the structure shown in FIG. 1A.

Figure 5A:
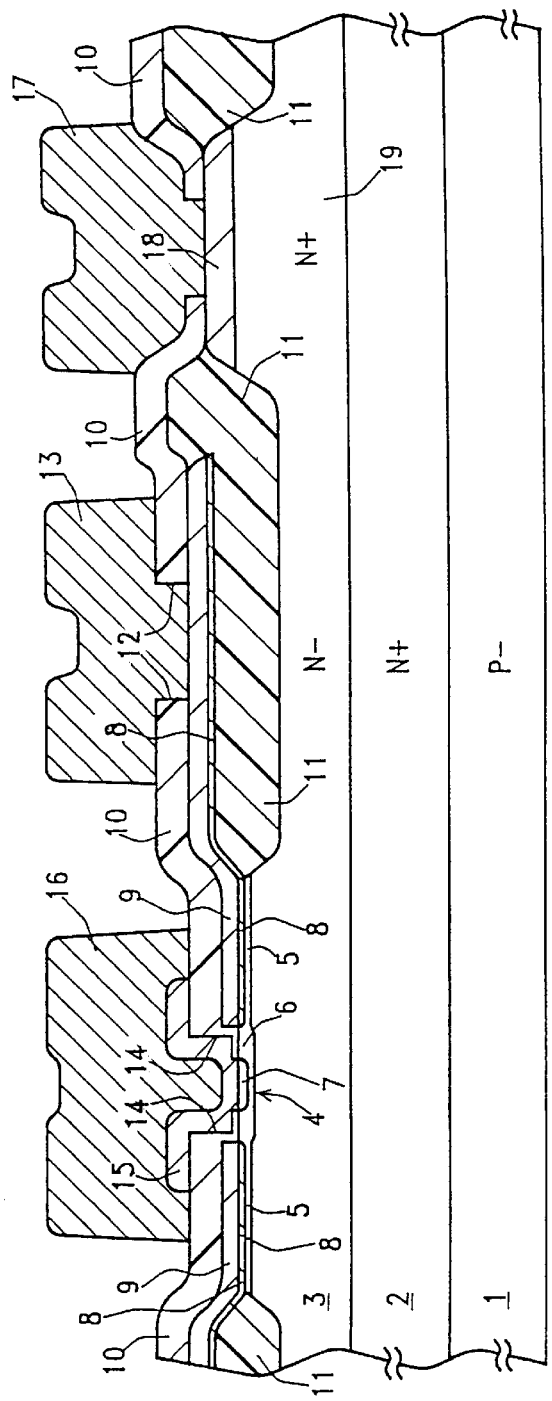
FIG. 5A is a cross-sectional view of a high-frequency bipolar transistor integrated structure according to another embodiment of the present invention.

FIG. 5A shows a cross-sectional view of a high-frequency bipolar transistor according to a second embodiment of the present invention. In this embodiment, the silicide layer under the polysilicon layer is not only provided over the silicon surface, but extends over the field oxide area. In this way, the base series resistance $r_{bb'}$ is further reduced; for this same reason, it is also possible to reduce the doping level of the first polysilicon layer, by means of a lighter implant; this also helps to reduce the depth of the extrinsic base region. In this second embodiment, titanium silicide, instead of cobalt silicide, has been employed.

A process for the manufacturing of a structure according to this second embodiment of the invention is analogous to the process previously described up to the formation of field oxide areas.

Figure 6:
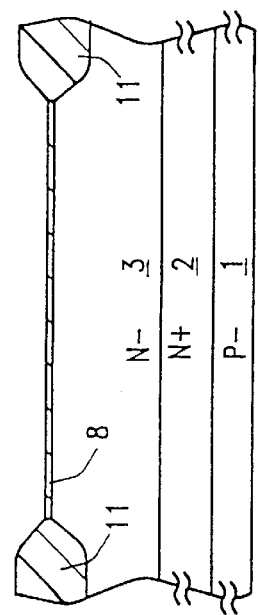
FIGS. 6 to 8 are cross-sectional views of a portion of the high-frequency bipolar transistor structure of FIG. 5A, taken at intermediate steps of its manufacturing process.
Figure 7:
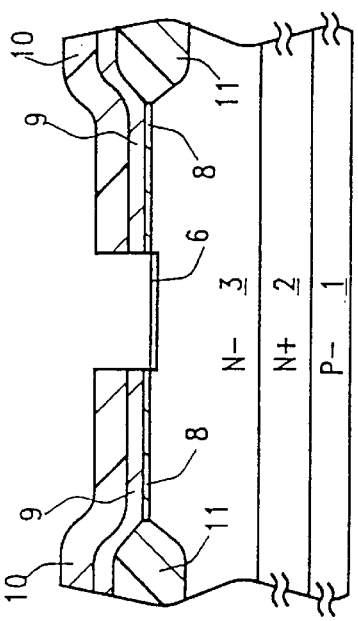
Figure 8:
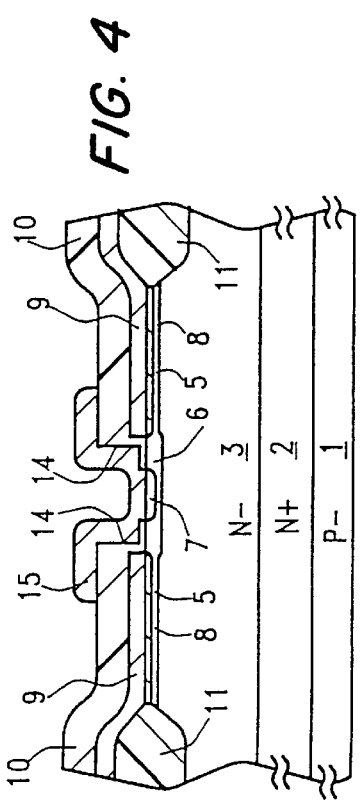

After the removal of $Si_3N_4$ and pad oxide used for the LOCOS process, a thin layer of titanium 31 is deposited over the entire surface of the structure (FIG. 6). Differently from the previous process, however, this step is not immediately followed by the formation of the silicide. Instead, the first polysilicon layer 9 is deposited over the titanium layer 31, and successively doped, and then the oxide layer 10 is deposited over the first polysilicon layer 9 (FIG. 7).

The successive steps are directed to the formation of the emitter window, by etching the oxide, polysilicon and titanium layers 10, 9 and 31. The titanium silicide layer is formed, after the emitter window has been opened, by submitting the structure to a thermal process.

It is also possible to form the titanium silicide layer 8 before the emitter window definition; in this case the etching affects the oxide, polysilicon and titanium silicide layers 10, 9 and 8.

Differently from the previous process, silicide is formed not only directly over silicon, but also over the field oxide areas, below the polysilicon layer.

From this point on, the process is substantially the same as the previously described process.

Figure 1B:
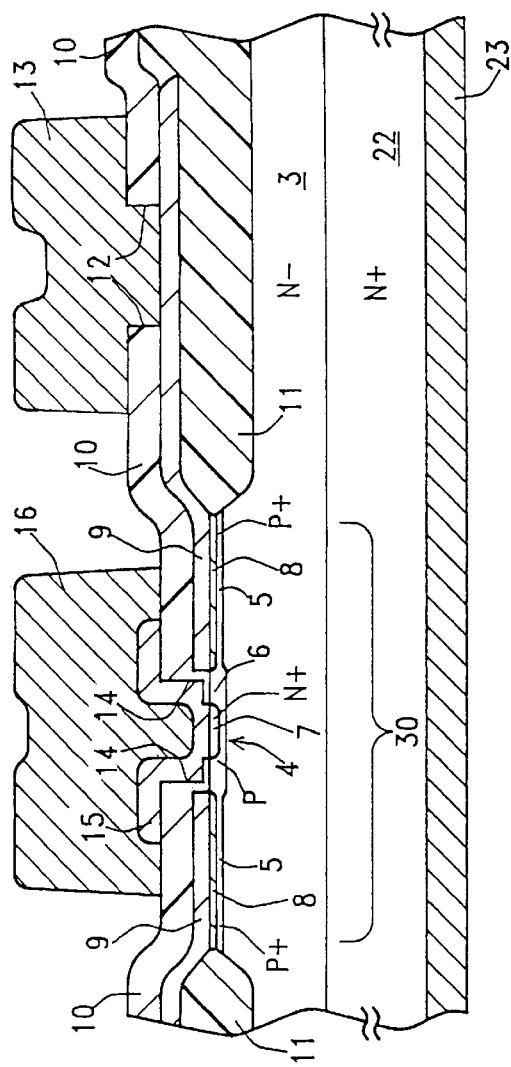
FIG. 1B is a variation of the structure of FIG. 1A, showing a discrete high-frequency bipolar transistor.
Figure 5B:
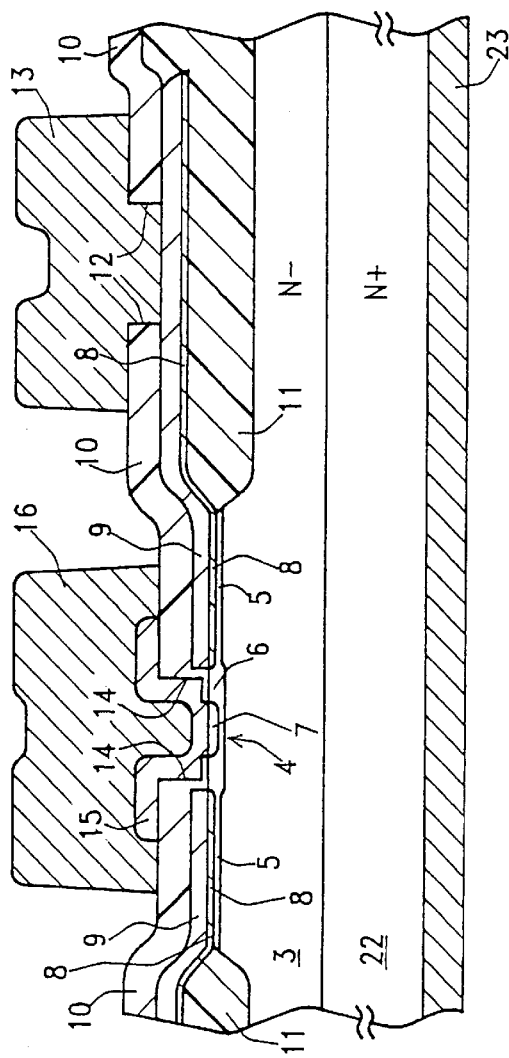
FIG. 5B is a variation of the structure of FIG. 5A, again referred to a discrete high-frequency bipolar transistor.

The teachings of this invention can be applied to the manufacture of high frequency bipolar discrete transistors. In such case, as can be seen from FIGS. 1B and 5B, the N-type epitaxial layer 3 is grown over a heavily doped N type substrate 22, and the collector metal electrode 23 can be moved on the back side of the wafer, on the surface opposite to the base and emitter metal electrodes 16 and 13, in contact with the heavily doped substrate 22.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. High-frequency bipolar transistor structure, comprising a base region of a first conductivity type formed in a silicon layer of a second conductivity type such that at least a portion of the base region is positioned lower in the structure than an upper surface of the silicon layer of the second conductivity type, said base region comprising an intrinsic base region having a first doping concentration surrounded by an extrinsic base region having a second doping concentration which is different than the first doping concentration, an emitter region of the second conductivity type formed inside said intrinsic base region, the extrinsic base region and the emitter region being contacted by a first polysilicon layer and by a second polysilicon layer, respectively, the first and second polysilicon layers being respectively contacted by a base metal electrode and by an emitter metal electrode, a silicide layer being provided between said extrinsic base region and said first polysilicon layer to reduce the extrinsic base resistance of the bipolar transistor, wherein said extrinsic base region is shallower than said intrinsic base region, and wherein at least a portion of said silicide layer is positioned lower in the structure than an upper surface of said intrinsic base region.

2. High-frequency bipolar transistor structure according to claim 1, wherein said silicide layer is a cobalt silicide layer.

3. High-frequency bipolar transistor structure according to claim 1, said extrinsic base region being surrounded by a thick field oxide region and the first polysilicon layer extending over said field oxide region, wherein the silicide layer also extends over the field oxide region.

4. High-frequency bipolar transistor structure according to claim 3, wherein said silicide layer is a titanium silicide layer.

5. High-frequency bipolar transistor structure according to claim 1, the bipolar transistor being a component of an integrated circuit, wherein said silicon layer is a lightly doped layer superimposed over a heavily doped layer of the second conductivity type, superimposed in turn over a semiconductor substrate of the first conductivity type which forms a common substrate of the integrated circuit.

6. High-frequency bipolar transistor structure according to claim 1, the bipolar transistor being a discrete component, wherein said silicon layer is a lightly doped layer superimposed over a heavily doped semiconductor substrate of the second conductivity type.

7. Bipolar transistor structure, comprising a base region of a first conductivity type formed in a silicon layer of a second conductivity type such that at least a portion of the base region is positioned lower in the structure than an upper surface of the silicon layer of the second conductivity type, said base region comprising an intrinsic base region having a first doping concentration surrounded by an extrinsic base region having a second doping concentration which is different than the first doping concentration, an emitter region of the second conductivity type formed inside said intrinsic base region, the extrinsic base region and the emitter region being coupled to a first polysilicon layer and a second polysilicon layer, respectively, and a silicide layer being provided between said extrinsic base region and said first polysilicon layer, wherein at least a portion of said silicide layer is positioned lower in the structure than an upper surface of said intrinsic base region.

8. The bipolar transistor structure of claim 7, wherein said extrinsic base region is shallower than said intrinsic base region.

9. The bipolar transistor structure of claim 7, wherein said silicide layer is a titanium silicide layer.

10. The bipolar transistor structure of claim 7, wherein said silicon layer is a lightly doped layer superimposed over a heavily doped layer of the second conductivity type.

11. The structure of claim 10, wherein the heavily doped layer of the second conductivity type is superimposed over a semiconductor substrate of the first conductivity type which forms a common substrate of an integrated circuit.

12. The bipolar transistor structure of claim 7, wherein the silicide layer is provided between said extrinsic base region and said first polysilicon layer to reduce the extrinsic base resistance of the bipolar transistor.

13. Semiconductor structure comprising a polysilicon layer, an epitaxial layer, an intrinsic base region formed in the epitaxial layer such that at least a portion of the intrinsic base region is positioned lower in the structure than an upper surface of the epitaxial layer, and a silicide layer, disposed between the polysilicon layer and the epitaxial layer so that dopants can diffuse from the polysilicon layer into the epitaxial layer via the silicide layer, wherein at least a portion of said silicide layer is positioned lower in the structure than an upper surface of said intrinsic base region.

14. The semiconductor structure of claim 13, further including an extrinsic base region surrounding the intrinsic base region, wherein at least a portion of the extrinsic base region is formed by the diffusion of dopants from the polysilicon layer into the epitaxial layer via the silicide layer, the extrinsic base region having a different doping concentration than the intrinsic base region.

15. The High-frequency bipolar transistor structure of claim 1, wherein the silicide layer is in physical contact with an upper surface of the extrinsic base region.

16. The bipolar transistor structure of claim 7, wherein the silicide layer is in physical contact with an upper surface of the extrinsic base region.

* * * * *